INVENTOR
HUGO GEORG BRUIJNING
BY
Frank R. Trifari
AGENT 3,168,714
STABILIZATION OF A TRANSISTOR OSCILLATOR BY MEANS OF AN OVERFLOW CIRCUIT WITH REDUCED POWER LOSS Hugo Georg Bruijning, Eindhoven, Netherlands, assignor to North American Philips Company, Inc., New York, N.Y., a corporation of Delaware Filed Mar. 31, 1961, Ser. No. 99,934
Claims priority, application Netherlands, Apr. 25, 1960, 250,873
9 Claims. (Cl. 331—113)

Figures 1, 2:
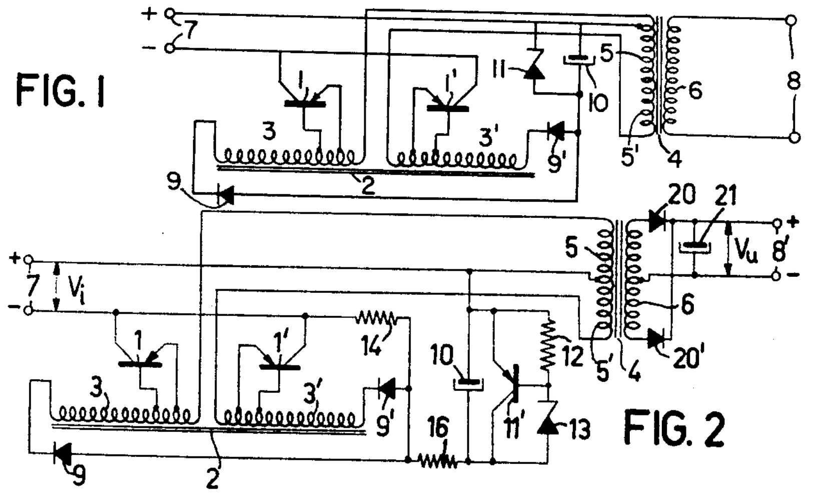

This invention relates to an oscillator comprising at least one junction transistor and having feedback between the emitter collector circuit and the base circuit thereof, more specifically, it relates to such an oscillator in which, in order to stabilize the amplitude of the oscillations produced and/or in order to protect the transistors against over-voltages which may occur when the oscillator is comparatively slightly loaded, an overflow circuit is provided which comprises a rectifier coupled to the base circuit, the recitifier passing only forward feedback pulses having an amplitude beyond a threshold value of the oscillation amplitude.

Transistor oscillators are increasingly being used in converters, especially in direct voltage converters. The efficiency of such converters is very high and may even exceed 90%. Also, with the aid of a modern power transistor, power of the order of 100 watts may be converted by means of a pair of transistors in push-pull connection. In a known oscillator provided with an overflow circuit; considerable power is lost in the overflow circuit when the load is comparatively small, in addition, fixing and/or controlling the threshold value requires the use of a number of auxiliary elements. A similar stabilization effect has been obtained by means of a so-called "recovery" diode. The circuit of this diode includes a winding coupled to the output circuit of the oscillator and a threshold voltage source constituted by the supply source of the oscillator. When the amplitude of the voltage across the winding exceeds the value of the supply voltage, an overflow current flows through the diode to the supply source. This current damps the output circuit of the oscillator and hence limits the amplitude of the output voltage; the energy taken from this output circuit through the diode is returned to the supply source. As a result, the overflow or control losses generally are negligible. Such a circuit arrangement is shown in U.S. Patent 2,965,806, December 20, 1960, assigned to the assignee of the instant application. In this patent, diode 21 of FIG. 9 functions as the recovery diode. This recovery circuit is very simple and obviously may also be used for limiting the forward feedback pulses applied to the base of the transistor. However, when used for this purpose, the recovery circuit has a limitation in that the threshold voltage is generally too high, and is held at the same value as the supply voltage thus being fixed to the latter or varying therewith; this is generally undesirable.

As used herein, the term "recovery diode" shall be understood to mean a diode by means of which part of the output power of a generator is returned to the D.C. supply source powering this generator when the output voltage of the generator exceeds a desired value.

It is the object of the invention to provide a stabilized transistor oscillator of the type defined above, in which the control or overflow losses are reduced to a small fraction of the value normally to be expected, and the threshold voltage at which the control or overflow action sets in can be freely chosen and/or controlled.

The invention is based in part on the recognition of the fact that, in order to obtain the same control effect the overflow current can be reduced by a certain factor if the feedback voltage is stepped up in the same proportion before being applied to the overflow circuit; owing to the control effect the effective voltage across the overflow circuit increases in a much smaller degree than corresponds with the transformation ratio.

According to one aspect of the invention, the feedback voltage supplied to the base of the transistor is stepped up, this stepped up voltage being applied across the overflow circuit, while the rectifier is polarized by a source of reverse threshold voltage, so that the rectifier becomes conductive beyond the threshold value of the feedback voltage and the overflow losses occurring above this threshold value are considerably reduced.

Figure 3:
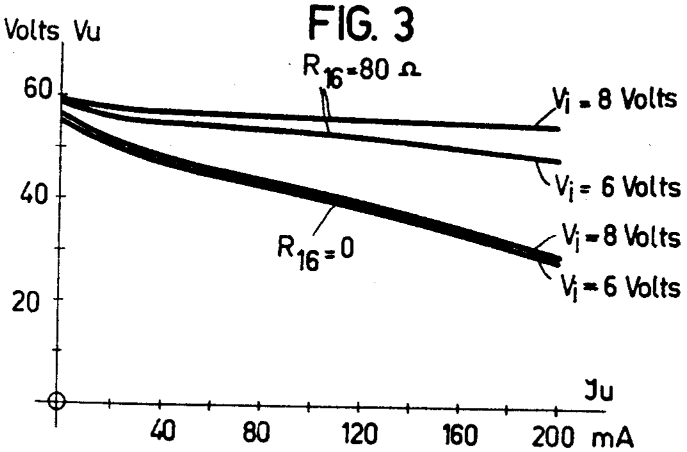
Figure 4:
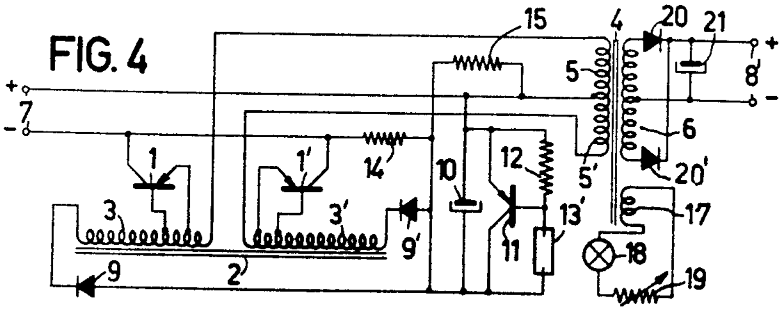

In order that the invention may readily be carried out, three embodiments thereof will now be described, by way of example, with reference to the accompanying schematic drawings, in which:

FIG. 1 is the circuit diagram of a simple embodiment of the oscillator according to the invention, FIG. 2 is the circuit diagram of a second embodiment, FIG. 3 shows load curves of the embodiment shown in FIG. 2, and FIG. 4 is the circuit diagram of a third embodiment.

The oscillator shown in FIG. 1 includes two transistors 1 and 1'. The emitter collector circuit of each of these transistors include a part of a winding 3 and 3' respectively of the transformer 2 and a part 5 and 5' respectively of the primary winding of an output transformer 4. The transistors are connected in push-all and provided with feedback by means of the transformer 2. It is known, for example from the U.S. Patent No. 2,774,878, to use a separate feedback transformer in such an oscillator.

The oscillator is fed by a direct voltage source 7, for example a 6 v. battery, and a load can be connected to its output terminals 8 which are connected to a secondary winding 6 of the output transformer 4. The base of either transistor is connected to a further tapping on the relevant winding 3 or 3' respectively and the oscillator is provided with an overflow circuit limiting the power supplied to the bases of the transistors 1 and 1'. For each transistor 1 and 1' the overflow circuit includes a diode 9 and 9' respectively connected in the forward direction between the base circuit of the transistor and a source of threshold voltage.

This source of threshold voltage comprises an electrolytic capacitor 10 shunted by a non-linear resistance, in the case shown a Zener diode 11, by means of which the voltage across this capacitor is limited and maintained constant. The capacitor 10 is charged by the overflow current passed by the diodes 9 and 9' when the oscillator is operating.

As is mentioned above, transistor oscillator circuit arrangements are known in which the amplitude of the output oscillations is controlled or limited by means of an overflow circuit coupled to the base circuit or control circuit of the transistor. This method is particularly effective if the transistor is excited by means of a separate feedback transformer, for in this case the energy dissipated in the overflow circuit is directly drawn from this feedback circuit and only indirectly from the output circuit, so that the same control effect can be obtained with a smaller loss of energy.

According to the invention, the effect of a certain energy loss in the overflow circuit is reduced by a considerable factor in that the energizing voltage applied to the base of the transistor is stepped up before being applied to the overflow circuit. In the oscillator shown in FIG. 1, this transformation is effected by the winding 3 or 3' respectively, the diodes 9 and 9' being connected to the ends of the respective windings, the emitter and base of the transistor being connected to tappings on this winding. In a practical embodiment, each winding 3 and 3' comprised a first part of 3 turns connected between the relevant end of the winding 5 or 5' and the emitter of the transistor 1 or 1', a feedback part connected between the base and the emitter of the transistor 1 or 1' and having 20 turns, and a step-up part connected between the base of the transistor 1 or 1' and the corresponding diode 9 or 9' of the overflow circuit and having 200 turns.

When an oscillator of the kind shown in FIG. 1 and designed as a converter was fed with a direct voltage of 6 v. and a given load was connected across the terminals 8, the current absorbed was 3 amperes. The diodes 9 and 9' were connected to the same tappings as the bases of the transistors. Since the feedback transformer had a transformation ratio of 3:20, on removal of the load the diodes 9 and 9' passed an overflow current of about one half ampere. The voltage applied to the overflow circuit was about 6 v. and the overflow current thus corresponded to a power loss of 3 w. which had to be delivered by the source 7.

The diodes 9 and 9' were then connected to the ends of the windings 3 and 3', respectively, as shown in FIG. 1. As a result, the overflow or loss current was reduced by a factor of 10, whereas the loss voltage across the overflow circuit was not even doubled. Thus, by this step, the overflow or control losses were reduced by a factor of more than 5, whereas the operation of the overflow circuit remained substantially the same with respect to the dependence of the output voltage on the load imposed. The square-wave voltage across the windings 5 and 5' was 5 v.

The Zener diode 11 may alternatively be replaced by another type of non-linear resistance, for example a voltage-dependent resistor (VDR). In this case, the threshold voltage across the capacitor 10 would not remain constant but would vary with the overflow current, and this is generally undesirable.

The second and third embodiments shown in FIGS. 2 and 4 differ from the first embodiment in a few respects only, and like elements are designated in FIGS. 2 and 4 by the same reference numerals as in FIG. 1.

The oscillators shown in FIGS. 2 and 4 form part of direct-voltage converters. Accordingly, the secondary 6 of the output transformer 4 is provided with a center tap connected to the lower (negative) output terminal 8' of the converter. The ends of this winding are connected, through diodes 20 and 20' respectively, to the upper positive terminal 8', with positive and negative terminals 8' being bridged by an electrolytic capacitor 21.

In the embodiment shown in FIG. 2, the overflow circuit includes a resistor 16 connected between the anodes of the two diodes 9 and 9' and the threshold voltage source including the capacitor 10. Furthermore, the Zener diode 11 is replaced by the emitter-collector circuit of an auxiliary transistor 11', the base of which is polarized by means of a voltage divider connected across the capacitor 10. This voltage divider comprises a resistor 12 connected between the base and the emitter of the transistor 11' and directly connected to the positive terminal of the supply source 7, and a Zener diode 13 connected between the base and the collector of the auxiliary transistor 11' and directly connected to the junction of the resistor 16 and the capacitor 10.

A further difference with respect to the oscillator shown in FIG. 1 consists in that the junction of the diodes 9 and 9' is not only connected to the threshold voltage source including the capacitor 10, but also, via a resistor 14, to the negative terminal of the supply source 7. The object of this arrangement is to cut off the diodes 9 and 9' when the oscillator is switched in, so as to facilitate starting.

When the Zener diode 11 is replaced by the transistor 11' controlled by a Zener diode 13, the maximum permissible overflow current is no longer restricted to the maximum permissible current through the Zener diode but to the maximum permissible emitter current of the transistor 11'.

A material improvement of the embodiment shown in FIG. 2 as compared with that of FIG. 1 is provided by the inclusion of the resistor 16. FIG. 3 shows the load curves: output voltage $V_u$ as a function of the output current $I_u$ of the direct-voltage converter shown in FIG. 2 for the case wherein the resistor 16 is equal to zero and for the case wherein this resistor has a value of 80 ohms, in both cases with input voltages $V_i$ of 6 and 8 v. As will be seen from the lower curves, the voltage converter in the case when resistor 16 is zero is subject to rather considerable ohmic voltage losses. These losses are substantially due to the base circuits of the transistors. By connecting the resistor 16 of 80 ohms in series in the overflow circuit, this ohmic voltage loss in the base circuits of the transistors 1 and 1' is largely compensated, as is shown by the two upper curves.

In the embodiment shown in FIG. 4, a further resistor 15 is connected between the junction of the resistor 14 and of the diodes 9 and 9' and the positive terminal of the supply source 7. The resistor 15 and resistor 14 constitute a voltage divider, so that only part of the voltage of the supply source 7 is applied as initial cut-off bias voltage to the anodes of the diodes 9 and 9'.

Another difference with respect to the embodiment shown in FIG. 2 consists in that the Zener diode 13 is replaced by a photo-sensitive resistance 13', for example a photo-electric resistance cell or photo-conductor employing cadmium sulphide. This photo-resistance or LDR 13' is arranged in a screening can together with an electric filament lamp 18. This lamp is fed by a second secondary winding 17 of the output transformer 4, via a variable resistor 19. It is mounted so as to enable it to irradiate the photo-resistor. This provides a strong negative feed-back which results in highly satisfactory stabilization of the output voltage across the terminals 8'. This output voltage can furthermore be adjusted to a desired value by varying the value of the resistor 19. In order to avoid instabilities of the converter circuit, however, the circuit should be designed so that the time constant of the lamp 18 together with the photo-resistor 13' and the capacitor 10 is not of the same order as that of the load and the capacitor 21.

The oscillators described are of the so-called saturation type, in which the end of the conductivity period of one or each transistor is brought about by the saturation of an element of the output circuit, either the output transformer 4 or the feedback transformer 2, or by reaching the saturation or bottoming curve of the transistor characteristic. The overflow or control circuit described can, however, be used in substantially any transistor oscillator arrangement.

It should be understood, therefore, that the particular embodiments of the invention shown in the drawings and described above, and in particular the quantitative values given, are illustrative only and represent only typical applications of the invention, without intending to limit the scope thereof.

What is claimed is:

1. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback means intercoupling said first and second circuits, and an overflow circuit including a rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source having a polarity to bias said rectifier in the reverse direction, transforming means coupled to said base circuit and acting to step-up the amplitude of the oscillations applied to the base electrode by the feedback means and to apply these stepped-up feedback oscillations to said overflow circuit.

2. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback transformer means intercoupling said first and second circuits, and an overflow circuit including a rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source having a polarity to bias said rectifier in the reverse direction, step-up means including a feedback winding of said transformer means, said feedback winding having a first portion connected between said emitter and base electrodes and an adjoining second portion connected between the base electrode and said overflow circuit, said feedback winding acting to step-up the amplitude of the oscillations applied to the base electrode by the feedback means and to apply these stepped-up feedback oscillations to said overflow circuit.

3. An oscillator as claimed in claim 2 and including at least one pair of push-pull connected junction transistors, said overflow circuit including one rectifier for each of the transistors, each rectifier being connected between said second portion of the feedback winding for the corresponding transistor and said threshold voltage source.

4. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback transformer means intercoupling said first and second circuits, and an overflow circuit including a rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source comprising a capacitor and a non-linear circuit element shunting said capacitor, said threshold voltage source having a polarity to bias said rectifier in the reverse direction, step-up means including a feedback winding of said transformer means, said feedback winding having a first portion connected between said emitter and base electrodes and an adjoining second portion connected between the base electrode and said overflow circuit, said feedback winding acting to step-up the amplitude of the oscillations applied to the base electrode by the feedback means and to apply these stepped-up feedback oscillations to said overflow circuit.

5. An oscillator as recited in claim 4, wherein said non-linear element comprises an auxiliary transistor having base, emitter and collector electrodes and an emitter-collector path, said emitter-collector path being connected across said capacitor, and further comprising a voltage divider connected across said capacitor, said voltage divider having a junction point connected to the base electrode of said auxiliary transistor.

6. An oscillator as recited in claim 4, wherein said non-linear element comprises a Zener diode connected across said capacitor.

7. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback transformer means intercoupling said first and second circuits, and an overflow circuit including a rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source comprising a capacitor and an auxiliary transistor having base, emitter and collector electrodes and an emitter-collector path, said emitter-collector path being connected across said capacitor, and further comprising a voltage divider connected across said capacitor, said voltage divider including a resistor connected between the emitter and base electrodes of the auxiliary transistor and a Zener diode connected between said collector and base electrodes of the auxiliary transistor, said threshold voltage source having a polarity to bias said rectifier in the reverse direction, step-up means including a feedback winding of said transformer means, said feedback winding having a first portion connected between said emitter and base electrodes and an adjoining second portion connected between the base electrode and said overflow circuit, said feedback winding acting to step-up the amplitude of the oscillations applied to the base electrode by the feedback means and to apply these stepped-up feedback oscillations to said overflow circuit.

8. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback transformer means intercoupling said first and second circuits, and an overflow circuit including a rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source comprising a capacitor and an auxiliary transistor having base, emitter and collector electrodes and an emitter-collector path, said emitter-collector path being connected across said capacitor, and further comprising a voltage divider connected across said capacitor, said voltage divider including a resistive element connected between the emitter and base electrodes of said auxiliary transistor and a light-sensitive resistor connected between the collector and base electrodes of the auxiliary transistor, an electric light source, means for energizing said light source comprising part of the oscillations of said oscillator, the light output of said light source being adapted to impinge upon said light-sensitive resistor, said threshold voltage source having a polarity to bias said rectifier in the reverse direction, step-up means including a feedback winding of said transformer means, said feedback winding having a first portion connected between said emitter and base electrodes and an adjoining second portion connected between the base electrode and said overflow circuit, said feedback winding acting to step-up the amplitude of the oscillations applied to the base electrode by the feedback means and to apply these stepped-up feedback oscillations to said overflow circuit.

9. An oscillator including at least one junction transistor, said transistor having base, emitter and collector electrodes, a first circuit including a source of D.C. supply voltage, said first circuit being connected between said emitter and collector electrodes, a second circuit connected to said base electrode, regenerative feedback means intercoupling said first and second circuits, and an overflow circuit including a rectifier and a resistor series-connected with said rectifier coupled to said second circuit, said overflow circuit being arranged to bypass the peaks of forward pulses fed back to said base electrode by said feedback means and corresponding to an amplitude of the oscillations exceeding a desired value, a threshold voltage source connected in the overflow circuit, said threshold voltage source having a polarity to bias said rectifier in the reverse direction, transforming means coupled to said base circuit and acting to step-up the amplitude of the oscillations applied to the base electrode by the feedback means and to apply these stepped-up feedback oscillations to said overflow circuit.

References Cited in the file of this patent

UNITED STATES PATENTS

| | | |
|---|---|---|
| 2,959,745 | Grieg | Nov. 8, 1960 |
| 2,968,738 | Pintell | Jan. 17, 1961 |
| 2,987,665 | Thompson | June 6, 1961 |